(12) United States Patent
Kumar et al.

(10) Patent No.: US 6,445,032 B1
(45) Date of Patent: *Sep. 3, 2002

(54) FLOATING BACK GATE ELECTRICALLY ERASABLE PROGRAMMABLE READ-ONLY MEMORY(EEPROM)

(75) Inventors: Arvind Kumar, New York; Sandip Tiwari, Ossining, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/072,293

(22) Filed: May 4, 1998

(51) Int. Cl.$^7$ .............................................. H01L 29/788
(52) U.S. Cl. ........................ 257/321; 257/315; 257/366
(58) Field of Search ................................. 257/315, 321, 257/365, 366

(56) References Cited

U.S. PATENT DOCUMENTS

| | | | |
|---|---|---|---|
| 4,704,705 A | | 11/1987 | Womack |
| 5,413,952 A | | 5/1995 | Pages et al. |
| 5,446,299 A | * | 8/1995 | Acovic ......................... 257/315 |
| 5,488,243 A | * | 1/1996 | Tsuruta ........................ 257/315 |
| 5,508,543 A | | 4/1996 | Hartstein et al. |
| 5,751,037 A | * | 5/1998 | Aozasa ......................... 257/315 |
| 5,856,690 A | * | 1/1999 | Burns .......................... 257/315 |
| 5,929,479 A | * | 7/1999 | Oyama ......................... 257/315 |
| 5,978,294 A | | 11/1999 | Ueno et al. |
| 6,057,212 A | | 5/2000 | Chan et al. |
| 6,069,819 A | | 5/2000 | Tiwari |

* cited by examiner

Primary Examiner—Jerome Jackson
(74) Attorney, Agent, or Firm—Marian Underweiser, Esq.; McGinn & Gibb, PLLC (57) ABSTRACT

A semiconductor memory and a method of producing the memory, includes a transistor including a first gate having an oxide, and a channel, and a back-plane including a second gate and an oxide thereover, the second gate formed opposite to the channel of the transistor, the second gate including a floating gate, wherein a thickness of the oxide of the back-plane is separately scalable from an oxide of the first gate of the transistor.

25 Claims, 4 Drawing Sheets

FLOATING BACK GATE ELECTRICALLY ERASABLE PROGRAMMABLE READ-ONLY MEMORY(EEPROM)

CROSS-REFERENCE TO RELATED APPLICATION

The present application is related to U.S. patent application Ser. No. 09/072,294, filed on May 4, 1998, to Chan et al., assigned to the present assignee, and incorporated herein by reference.

BACKGROUND OF THE INVENTION

1. Field of the Invention

The present invention generally relates to a semiconductor device and a method of forming a semiconductor device, and more particularly to a method of forming a semiconductor memory, including a flash memory, and scaling of a memory using a common substrate structure, and to the structure resulting from the inventive method, including a floating gate on a back-plane.

2. Description of the Related Art

Non-volatile electrically erasable and programmable memory structures (EEPROMs), such as a flash memory, utilize a floating gate whose charging is controlled by appropriate biasing of the source, drain and controlling gate. A flash memory is unique in providing fast compact storage which is both nonvolatile and rewritable.

In a flash memory, the threshold voltage Vt for conduction of a field-effect transistor (FET) changes state depending upon the amount of charge stored in a floating gate (FG) part of the FET. The floating gate is a charge storing region which is isolated from a more traditional control gate (CG) (connected by "wordline") by a dielectric commonly based on silicon dioxide. The state of the Vt changes with the amount of charge stored by the FG.

The gate stack in such structures includes the silicon channel with an injection/tunneling oxide, the floating gate and a thicker control oxide with a controlling gate on top. They are usually designed for flash erase in a block, for writing by word, and derive a density advantage from their single transistor (element) structure.

Use of floating gates in memories have their origin in the earlier work of Kahng (e.g., see D. Kahng et al., "A Floating Gate and its Application to Memory Devices," *Bell Systems Technical Journal*, 46 1288 (1967)) who described a non-volatile MOS memory with a conducting metal layer interposed between the gate and the channel with oxide as a separating layer. This structure used tunneling, direct and indirect, without the use of hot carriers. The ideas behind this structure evolved to use of dielectrics in MNOS cells (e.g., See H. A. R. Wagener et al., "The Variable Threshold Transistor, A New Electrically Alterable Non-Destructive Read-Only Storage Device," *Tech. Dig. of IEDM*, Washington D.C. (1987)), use of hot carriers to inject into floating gate structures (e.g., see D. Frohmann-Bentchkowsky, "A Fully Decoded 2048-bit Electrically Programmable MOS-ROM" *Tech. Dig. of ISSCC*, 80 (1971)) and the more write-efficient structures with an external gate whose various forms are used today (e.g., see Iizuka et al., "Stacked Gate Avalanche Injection Type MOS (SAMOS) Memory", *Tech. Dig. of 4th Conf. Sol. St. Dev.*, Tokyo (1972) and *Japan J. of Appl. Phys.*, 42 158 (1973)).

These forms of electrically erasable and programmable memories include structures such as flash structures using NAND and NOR architectures. Most of these structures use various hot carrier injection processes.

Figure 1A:
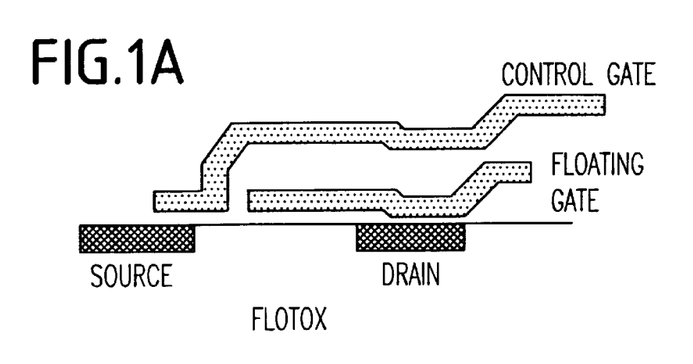
FIGS. 1(A)–1(D) illustrate a cross-section of some forms of exemplary floating gate memory structures, including respectively a floating gate with oxide injection (FLOTOX), erasable tunneling oxide (ETOX), source side injection (SISOS), and nano-crystal (nano-dimension quantum-dots)
Figure 1B:
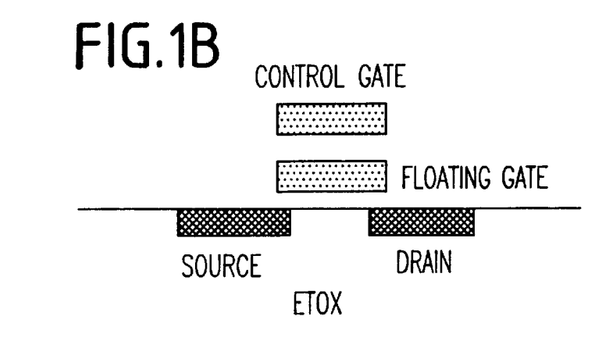
Figure 1C:
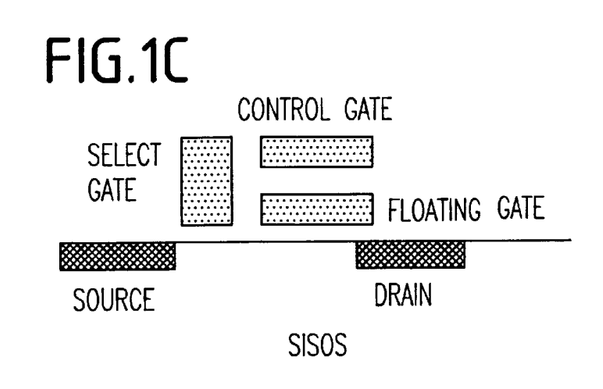

FIGS. 1(A)–1(C) illustrate some different types of structures which such non-volatile memories may adopt, such as a floating gate with oxide injection (FLOTOX) using injection from the drain, erasable tunneling oxide (ETOX) using injection from the channel, and, source side injection (SISOS) using injection from the source using a field from a select gate. Being a single element structure, these structures have advantages in packing, and they have specific forms of unipolar or bipolar write, erase, and read cycles that are compatible with non-volatile operation.

Figure 1D:
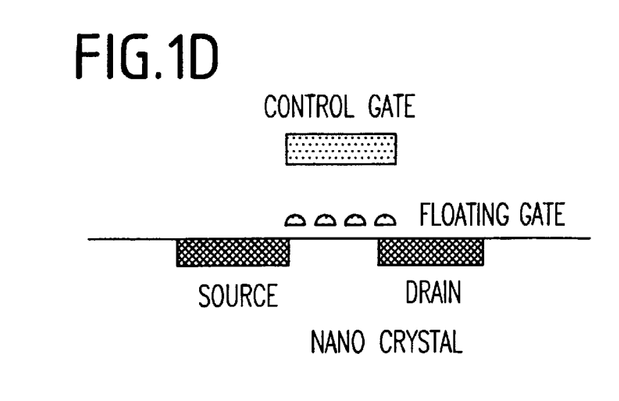

However, only one form (e.g., the nano-crystal memory, as disclosed in U.S. Pat. Nos. 5,508,543 and 5,714,766, commonly assigned with the present application and incorporated herein by reference) may use direct tunneling with non-volatility. An example of this structure is shown in FIG. 1(D).

A further problem arises in that, as device sizes shrink, it becomes increasingly difficult to make these memory structures since the injection oxide and the control oxide cannot be shrunk because of charge leakage. This non-scalability of oxide thickness results in a larger (e.g., longer) electrical distance between the controlling gate and the channel than the gate length. The larger electrical distance makes integration and higher density more difficult, if not impossible. Additional consequences include read disturbance, poor transconductance and poor sub-threshold characteristics, and limited cyclability.

Moreover, an essential requirement of scaling of all field-effect-based structures is that all electrical distances must be scaled together simultaneously. In flash memory structures where the vertical stack has a physical thickness exceeding 47 nm (e.g., currently limited by the injection oxide thickness (greater than 7 nm), floating gate thickness (greater than 30 nm), and the control gate thickness (greater than 10 nm)), a constraint is placed on both minimum device size and voltages and power at which the devices are operable.

SUMMARY OF THE INVENTION

In view of the foregoing and other problems of the conventional systems and methods, it is an object of the present invention to provide a floating gate memory structure compatible with advanced devices that utilize a buried floating gate derived from a back-plane.

Another object is to provide a method for producing a compact, highly integrated structure which is nonvolatile.

Yet another object is to provide a method for providing a structure with a sufficiently small floating gate that limits the number of electrons stored and hence power dissipation.

In a first aspect of the present invention, a semiconductor memory, includes a transistor including a first gate having an oxide, and a channel, and a back-plane including a second gate and an oxide thereover, the second gate formed opposite to the channel of the transistor, the second gate comprising a floating gate, wherein a thickness of the oxide of the back-plane is separately scalable from an oxide of the first gate of the transistor.

In a second aspect of the present invention, a backplane transistor, includes: a first gate having an oxide and a channel, forming a transistor; and a back-plane, formed opposite to the channel, forming a floating gate region for storing different states of memory and including an oxide, the back-plane being isolated to function as a floating gate, wherein a thickness of the oxide of the floating gate is separately scalable from a thickness of the oxide of the first gate of the transistor.

In a third aspect, a memory, includes a buried floating gate, and a top gate having an oxide, thereby forming a transistor having a transistor channel, wherein leakage from the floating gate is decoupled through an injection oxide from that of controlling a transistor channel of the memory, wherein the floating gate is formed from a back-plane, thereby allowing the top gate and the oxide of the top gate to be scalable according to a size of the memory.

In a fourth aspect of the present invention, a memory system, including a back-plane, includes a transistor including a control gate and a transistor channel, and a floating gate opposite to the control gate and beneath the transistor channel, the floating gate being a back-gate formed on the back-plane.

In a fifth aspect of the invention, a method of producing a floating gate on the back of a transistor channel, includes steps of: forming a buried oxide on a conducting substrate; forming a back-plane over the buried oxide; forming a back oxide over the back-plane; and forming a silicon layer over the back oxide, the silicon layer having a comparable thickness to that of the back-plane, through which charge gets injected into the back-plane.

In the invention, a floating gate, including either a semiconductor or a metal, is buried under a thin transistor channel. Charge on the floating gate determines the threshold voltage of the device. The transistor's conduction state can be read through a bias voltage at source, drain and the gate, thus describing the stored state of the device. The injection oxide for the buried floating gate can be made larger (e.g., approximately within a range of 7–10 nm) while the oxide for the top gate can be scaled to smaller dimensions.

By decoupling the oxide thickness of a floating gate from the scaling of the transistor, a device is achieved that can be scaled to significantly smaller dimensions than the conventional memory structures.

Further, by allowing for a large coupling capacitance between the floating gate and the channel and doped region, it allows for efficient transfer of electrons, without affecting the ability to sense the transistor conduction using the top gate.

Thus, the present invention describes a structure (and method)where the floating gate is decoupled, and is placed on the back of the conducting channel, thus allowing the top gate to be placed closer to the channel, and thereby resulting in stronger electrical control during a read operation.

By decoupling reading from charging and discharging, the structure of the present invention is more immune to read disturbances. Further, by providing for a very small floating gate region, the present invention provides for discrete electron sensitivity and low power consumption. Hence, a structure with a sufficiently small floating gate is provided which limits the number of electrons stored and hence power dissipation by having a capacitance in a small area which can store discrete electrons.

Additionally, by providing for a scaled control gate, the present invention allows for superior transistor characteristics, such as, for example, in leakage and transconductance, than in conventional memories (e.g., flash memories).

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Referring now to the drawings, and more particularly to FIGS. 2(A)–4(F), there is shown a preferred embodiment of the present invention.

As mentioned above, the present invention provides a floating gate memory structure compatible with advanced devices that utilize a buried floating gate, and a method of producing a compact, highly integrated structure which is nonvolatile.

The present inventors have found that achieving acceptable transistor characteristics, as gate lengths are reduced, is made possible by decoupling of the floating gate leakage through the injection/tunnel oxide from that of controlling the transistor channel.

Accordingly, the present invention provides a memory structure in which a back-gate (e.g., a gate formed from a back-plane) serves as a floating gate. This allows the top gate and its oxide to be scalable to requirements originating in the length scaling of the structure.

Typically, back-gates can be larger in size, and hence more efficiently coupled for injection, and can use any of the tunnelling mechanisms employed in making floating gate memories together with their oxide and bias voltage requirements, but can allow the front gate to be shrunk to smaller dimensions. Hence, the area occupied by the memory can be decreased as a whole.

By using silicon, mid-gap materials (e.g., W, WN, TiN, and germanium, silicon carbide and the like), and/or high temperature silicon-compatible non-reactive material such as W, WN, TiN, silicon, germanium, silicon carbide, and the like, for back-gates, lower voltages, lower power and higher density become simultaneously possible.

Generally, the floating gate, including either a semiconductor or a metal, is buried under a thin transistor channel, and a charge on the floating gate determines the threshold voltage of the device. The transistor's conduction state can be read through a bias voltage at source, drain and the gate, thus describing the stored state of the device. Moreover, the injection oxide for the buried floating gate can be made larger while the oxide for the top gate can be scaled to smaller dimensions, thereby providing a "decoupling" of the floating gate's thickness from the top gate's thickness and thereby providing for higher integration and density.

Figure 2A:
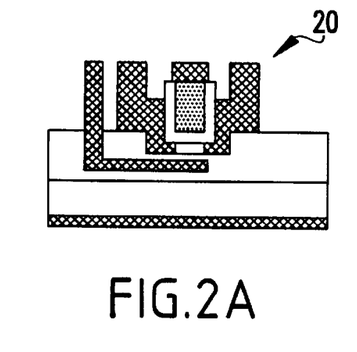
FIGS. 2(A) and 2(B) respectively illustrate a schematic cross-section and a device layout of a transistor (with a front gate and a back-gate) and FIGS. 2(C) and 2(D) illustrate a cross-section and a device layout of a memory structure with a floating gate opposite to the channel of the transistor and the control gate.
Figure 2B:
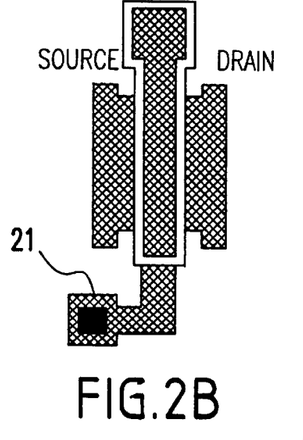

First, as shown in FIGS. 2(A) and 2(B), a schematic cross-section and device layout of a transistor (with a front gate and a back-gate) is provided. Further, FIGS. 2(C) and 2(D) illustrate a cross-section and device layout of a memory structure floating gate opposite to the channel of the transistor and the control gate.

FIG. 2(A) illustrates the cross-section of a small transistor 20 (e.g., a select transistor) that uses a back-plane gate 21 (e.g., a "back-gate" 21) to control the threshold voltage and to keep the carriers at the top gate's oxide/silicon interface. FIG. 2(B) illustrates a device layout of the select transistor of FIG. 2(A).

Figure 2C:
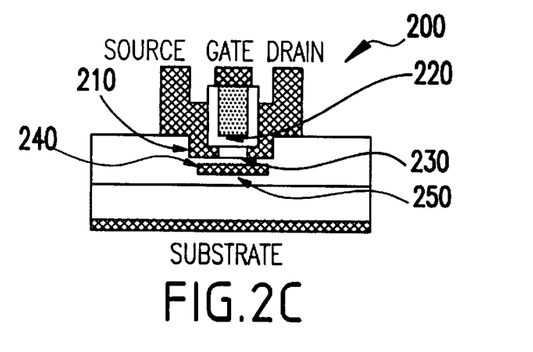
Figure 2D:
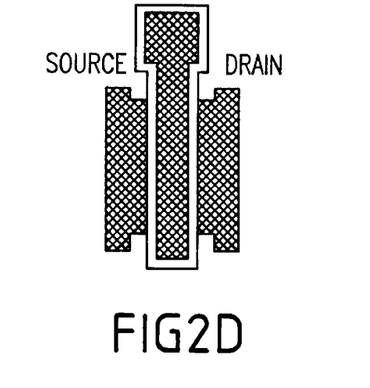

FIG. 2(C) illustrates a floating gate which stores charge and affects the threshold voltage of the top gate transistor above it. The structure of the present invention is incorporated into the memory structure 200 of FIGS. 2(C) and 2(D).

As shown in FIG. 2(C), source, gate and drains are provided. Further shown are a silicon channel 210, a read oxide 220, a tunnel oxide 230, a floating silicon gate 240, and a back control oxide 250 on a substrate (e.g., silicon or the like).

It is noted that the charging in the back-floating structure requires bias that is conducive to electron injection into the underlying floating gate region. This can be accomplished by raising the channel higher in energy with respect to the substrate even when it is conducting.

For example, a negative potential applied to source, a smaller negative potential applied to the drain, a zero or other potential applied to the top gate so that electrons are attracted to the channel, and a zero or positive potential applied to the substrate allows conduction to take place in both the top and bottom channel of the transistor, and allows hot electron and Fowler-Nordheim tunneling to occur to the underlying floating gate region. There are other schemes of applied potential that give rise to a similar injection.

The absence of charge in the underlying floating gate leads to a low state of threshold voltage in an N-channel device, whereas the presence of charge leads to a higher state of threshold voltage for the transistor above. As a result, the conduction characteristics of the top device change as shown schematically in FIG. 3. The scheme would be different for a P-channel device.

Figure 3:
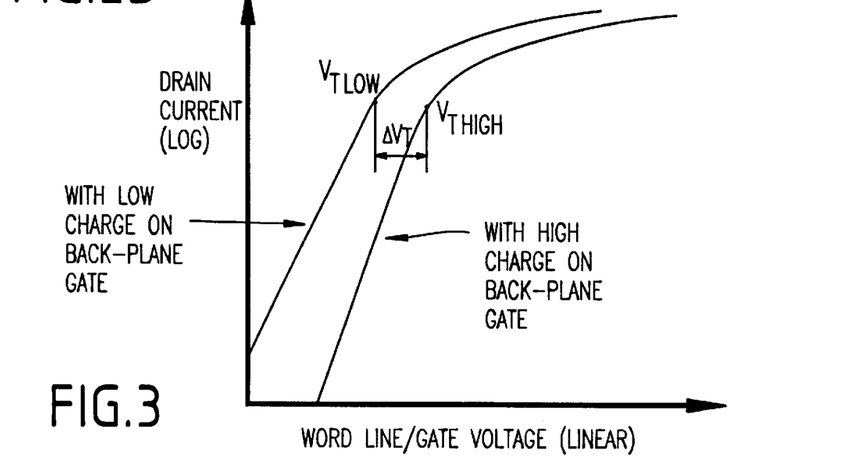
FIG. 3 illustrates transistor conduction characteristics of the present invention, as a function of the gate voltage for low and high charge on the floating back-plane gate.

FIG. 3 shows the low threshold voltage state with no charge (or low charge density such as $10^{11}$ cm$^{-2}$) on the floating gate as well as the high threshold voltage state with electron charge on the floating gate.

Turning now to FIGS. 4(a)–4(f), there are shown process steps of a method according to the present invention for producing a floating gate on the back of a transistor channel, and the resulting structure. This allows for dimensions that can be ultimately made smaller than those of conventional memories. It also shows how, by having a floating gate, with larger electron affinity than the transistor channel, a low voltage and low power operation is achieved.

Figure 4A:
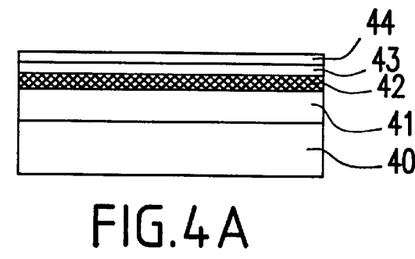
FIGS. 4(A) to 4(F) illustrate a preferred embodiment of the method of forming a back-floating gate memory structure according to the present invention.

Referring to FIG. 4(a), in step 1, a conducting substrate 40 is prepared. Two methods for fabricating this substrate 40 are described in U.S. patent application Ser. No. 09/072,294, May 4, 1998 by Chan et al., incorporated herein by reference and commonly assigned to the present assignee.

As shown in FIG. 4(a), a buried oxide 41 is present on a substrate 40, with a back-plane 42 over the buried oxide 41, followed by a back oxide 43 and a top silicon layer 44 thereover.

The top silicon layer 44 is a thin layer (e.g., preferably having a thickness of substantially within a range of about 3–200 nm) under which is the back oxide 43 through which charge gets injected into the back-plane 42.

The back oxide 43 is preferably substantially within a range of about 5–15 nm thick. The back-plane 42 preferably has a thickness of substantially within a range of about 5 to 100 nm, and is preferably conductive silicon but alternatively may be germanium, W, TiN, WN, SiC or the like. The back-plane 42 has underneath it the buried oxide 41 that is substantially 10–30 nm thick on top of the conducting substrate 40. Oxides 41 and 43 can be silicon dioxide or nitrided silicon dioxide or other dielectrics compatible with low interface state density with silicon.

The back-plane 42 also can be a conductive high electron affinity 30 material which does not interact with the insulator around it, such as W, WN, TiN, Germanium, or the like. These materials are merely exemplary.

Figure 4B:
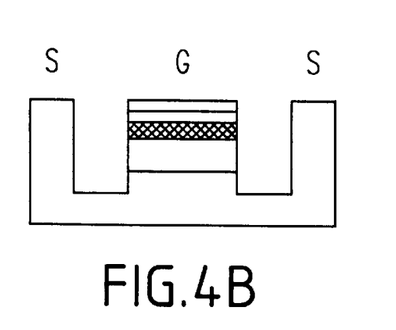
Figure 4C:
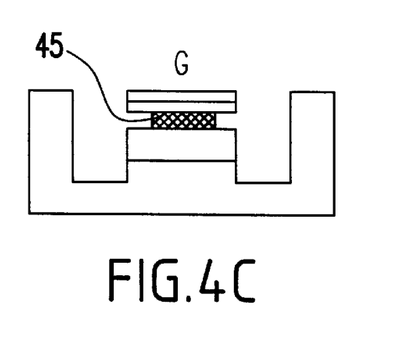
Figure 4D:
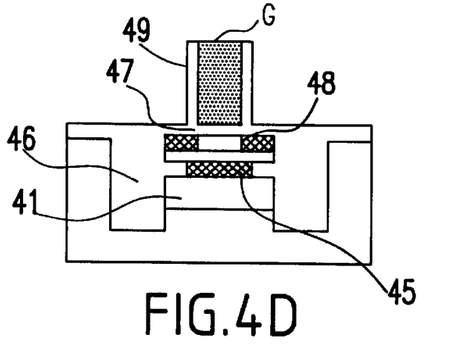

As shown in FIG. 4(B) and 4(C), after patterning the silicon region for the memory (e.g., silicon used for the source (S), drain (D) and channel region of the device and the floating gate region (G) having a floating gate 45, the same is filled with an insulator 46 such as an oxide, as shown in FIG. 4(D).

As further shown in FIG. 4(D), a control oxide 47 such as silicon dioxide, is grown on the substrate 40 to a preferred thickness of substantially within a range of about 1 nm to 5 nm. Oxide 47 serves as the control oxide for the transistor. The control oxide for the floating gate 45 is provided by buried oxide 41. A channel 48 is provided between the floating gate 45 and the control oxide 47 for the transistor.

Thereafter, gate material deposited substantially to a thickness of about 10 to 100 nm. The gate material may be, for example, polysilicon, or may be a non-reactive metal such as tungsten or titanium nitride The gate (G) is patterned, as shown in FIG. 4(D), in a conventional manner.

Thereafter, a thin side-wall oxide 49 is grown, preferably to a thickness substantially within a range of about 1 to 5 nm, and the doped link region is formed by ion implantation and annealing or other equivalent techniques, as are known in the art.

Figure 4E:
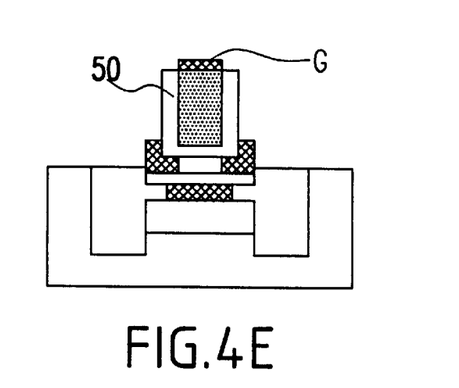
Figure 4F:
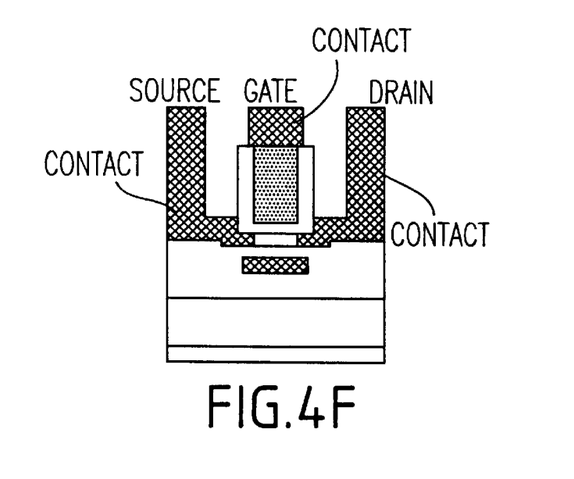

As shown in FIG. 4(E), a thicker oxide or other dielectric 50 is deposited to have a thickness substantially within a range of about 5 to 200 nm, and thereafter etched (e.g., by plasma processing) to form a side-wall, and a heavier doping is achieved by implantation and annealing or epitaxy which forms raised source and drain regions, as shown in FIG. 4(F).

As shown in FIG. 4(F), silicidation following removal of residual oxide on the source S, gate G, and the drain region D forms the contacts. To form the logic transistors, the back-plane gate is accessed by etching and contacting. This transistor can be operated as a dual-gate device (e.g., top and back shorted) or as a back-gated device by using the back-plane to control the threshold voltage of the transistor. The structures now can be interconnected with the rest of the logic, etc. on the wafer.

It is noted that in lieu of silicon, in another embodiment of the present invention, the underlying floating gate region can be formed from a material having a larger electron affinity than silicon (e.g., as described in U.S. Pat. No. 5,508,543, incorporated herein by reference). For example, instead of silicon, W, TiN, WN, etc. may be used in the same dimensions and operating conditions as discussed above for silicon.

In such a case, electron injection into the floating gate results in a larger barrier for extraction, and hence thinner oxides to the back can be used (e.g., the thinner oxides having a thickness substantially within a range of about 1–5 nm), and a write operation becomes possible at lower voltages (e.g., voltages of substantially between about 0.5 and 5 V with use of the thinner oxides) with non-volatility still being maintained. It is also more immune to "read disturbs", and hence allows for easier multi-level operation.

Regarding the practical applications of the present invention, several design variations are provided in FIGS. 5(A)–5(B) and 6(A)–6(B).

Figures 5A, 5B:
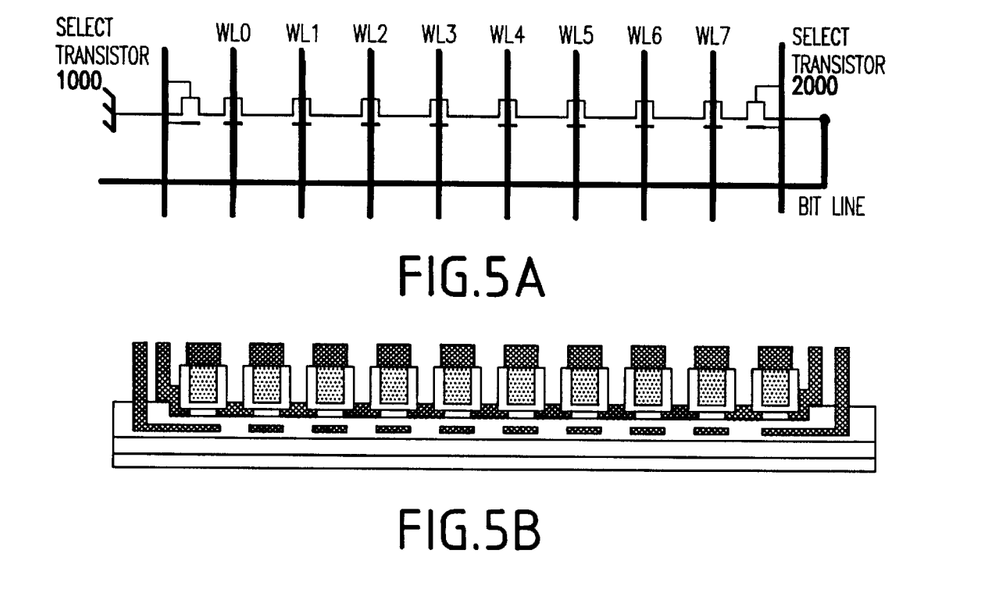
FIGS. 5(A) and 5(B) respectively illustrate a circuit diagram and a cross-section of a memory according to the present invention, exemplarily designed as an 8-bit NAND-structured cell including select transistors having a back-plane gate externally available.

Specifically, FIGS. 5(A) and 5(B) show a structure where the memory is exemplarily designed as an N-bit (e.g., 8-bit) NAND-architected structure including select transistors having a back-plane gate externally available.

More specifically, FIGS. 5(A) and 5(B) respectively illustrate a circuit diagram and a cross-section of a memory according to the present invention, exemplarily designed as an 8-bit NAND-architected cell structure including select transistors 1000, 2000 having a back-plane gate externally available. Using a common substrate structure, by keeping the back-plane gate floating, 8 memory cells are made, and by accessing the back-plane, two select transistors have been made. Obviously, other architectures are possible such as 16-bit, 32-bit, etc. Moreover, the flash cells can be used in a different manner in the NAND structure.

It is noted that the select transistors 1000, 2000 in FIGS. 5(A) and 5(B) look similar to other devices such as, for example, logic transistors. A key advantage and feature of the present invention is that a simplified structure results in that by simply connecting a contact differently, a structure having substantially the same structure, but having a different function is provided. For example, instead of connecting a contact to the top gate as shown in FIG. 5(A) in the case of select transistors 1000, 2000, another connection arrangement may be provided, thereby providing a different function (e.g., a logic transistor) even though the structures, absent the connection, appear substantially the same. This simplifies manufacturing and increases versatility of the resulting products since one resulting structure can be used to have different functions.

Figure 6A:
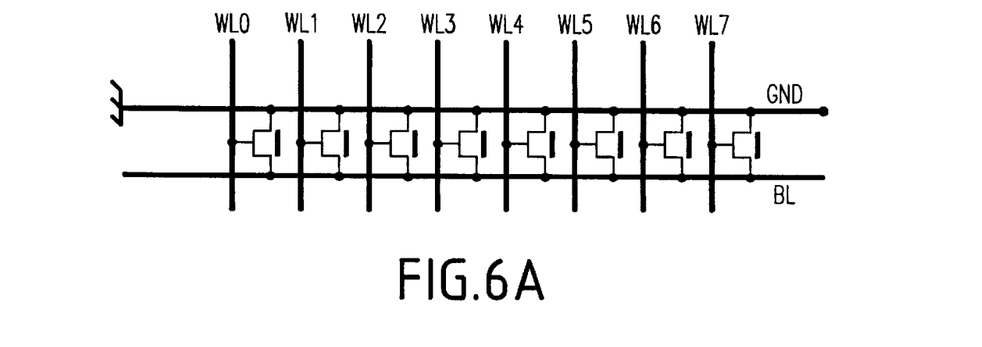
FIGS. 6(A) and 6(B) respectively illustrate a circuit diagram and a cross-section of a memory according to the present invention, exemplarily designed as a NOR-structured cell.
Figure 6B:
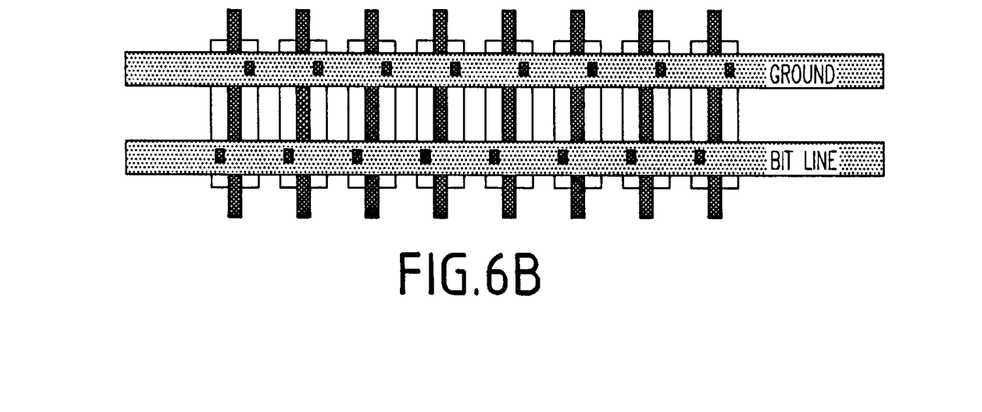

FIGS. 6(A) and 6(B) respectively illustrate a circuit diagram and a cross-section of a memory according to the present invention, exemplarily designed as a NOR-architected cell structure. It is noted that other logic functions can still be performed on this common substrate by accessing the back-plane gate. If the floating gate is very small in dimension (e.g., about 100 nm in thickness), then its capacitance and density of states are small, and hence the floating gate stores fewer electrons. In such a case, the memory becomes discrete electron-sensitive. Thus, by providing for a very small floating gate region, discrete electron sensitivity and low power consumption result, and the sufficiently small floating gate limits the number of electrons stored and hence power dissipation.

Thus, as described above, with the unique and unobvious structure and method of the present invention, a floating gate (e.g., a semiconductor or a metal) is buried under a thin transistor channel, with the charge on the floating gate determining the threshold voltage of the device. The injection oxide for the buried floating gate can be made larger (e.g., approximately within a range of 7–10 nm) while the oxide for the top gate can be scaled to smaller dimensions.

By decoupling the oxide thickness of a floating gate from the scaling of the transistor, a device is achieved that can be scaled to significantly smaller dimensions than the conventional memory structures. Further, by allowing for larger coupling capacitance between the floating gate and the channel and doped region, more efficient transfer of electrons results, without affecting the ability to sense the transistor conduction using the top gate.

Hence, the present invention provides a structure and method where the floating gate is decoupled, and is placed on the back of the conducting channel, thereby allowing the top gate to be placed closer to the channel, and thereby resulting in stronger electrical control during a read operation.

The floating gate memory structure is compatible with advanced devices that utilize a buried gate, and allows a compact, highly integrated nonvolatile structure to be produced. The transistor's conduction state can be read through a bias voltage at source, drain and the gate, thus describing the stored state of the device. With the invention, the injection oxide for the buried floating gate can be made larger while the oxide for the top gate can be scaled to smaller dimensions, thereby providing a "decoupling" of the floating gate's thickness from the top gate's thickness and thereby providing for higher integration and density.

Moreover, lower power and lower voltage can be achieved by utilizing the small area and volume for the floating gate and higher electron affinity material for the floating gate.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor memory, comprising:
    a plurality of transistors, each said transistor including:
        a first gate having an oxide, and a channel; and
        a back-plane including a floating gate memory structure and a second gate and an oxide thereover, said second gate formed opposite to the channel of said transistor, said second gate comprising a back-plane gate, said back-plane gate being selectively contactable without an insulating layer therebetween; and
    a common conducting substrate extending substantially an entire length of multiple ones of said plurality of transistors,
    wherein a thickness of said oxide of said back-plane is separately scalable from an oxide of said first gate of said transistor,
    wherein a memory device of said semiconductor memory is realized when said back-plane gate is unconnected, said memory device assuming one of a charged and a discharged state, and
    wherein a logic device of said semiconductor memory is realized when said back-plane is directly contacted to form a bottom gate.

2. The memory according to claim 1, wherein said back-plane is formed from at least one of silicon, tungsten, tungsten-nitride, titanium nitride, and alloys thereof, and
    wherein said second gate of said back-plane forms a threshold controlling gate.

3. The memory according to claim 1, wherein said back-plane is formed from at least one of silicon and a high temperature silicon-compatible non-reactive material.

4. The memory according to claim 1, wherein said memory comprises a plurality of one of NAND-architected cells and NOR-architected cells.

5. The memory according to claim 1, wherein said back-plane gate is charged by a tunneling process from said transistor channel, said transistor overlying said back-plane gate.

6. The memory according to claim 1, wherein said transistor is selectively operable as one of a back-gated device by using the back-plane and a dual-gate device being top and back-shorted, to control a threshold voltage of said transistor, said transistor, other than a manner of connection with a contact, having a same structure regardless of being operable as either of the back-gated device and said dual-gate device.

7. The memory according to claim 1, wherein said back-plane gate is buried under the transistor channel and a charge on said back-plane gate determines a threshold voltage of the memory.

8. The memory according to claim 2, wherein a conduction state of said transistor is readable through a bias voltage at a source, a drain, a gate, and a substrate of said transistor.

9. The memory according to claim 7, wherein said back-plane gate comprises a buried connectable gate with said oxide thereover, said oxide comprising an injection oxide substantially within a range of about 7–10 nm and said oxide of the first gate being substantially within a range of about 1 to 5 nm.

10. The memory according to claim 1, wherein said back-plane gate has a predetermined size for discrete electron sensitivity and for storing discrete electrons therein.

11. A backplane transistor, comprising:

a first gate having an oxide and a channel, forming a transistor;

a back-plane, formed opposite to said channel, forming a floating gate region for storing different states of memory and including an oxide, the back-plane being isolated to function as a connectable gate, said back-plane being selectively contactable without an insulating layer therebetween; and a common conducting substrate extending substantially an entire length of said transistor and an adjacent transistor, wherein a thickness of said oxide of said connectable gate is separately scalable from a thickness of said oxide of said first gate of said transistor, wherein a memory device is realized when said back-plane is unconnected and said states of memory assume one of a charged and a discharged state, and wherein a logic device of said memory device is realized when said back-plane is directly contacted to form a bottom gate.

12. The backplane transistor according to claim 11, wherein said back-plane is formed from at least one of silicon, tungsten, tungsten-nitride, titanium nitride, and alloys thereof.

13. The backplane transistor according to claim 11, wherein said back-plane is formed from at least one of silicon and a high temperature silicon-compatible non-reactive material.

14. A memory including a plurality of transistors, comprising:

a buried connectable gate;

a top gate having an oxide, thereby forming a transistor having a transistor channel; and a common conducting substrate extending substantially an entire length of multiple ones of said plurality of transistors, wherein leakage from the connectable gate is decoupled through an injection oxide from that of controlling a transistor channel of said memory, wherein said connectable gate is combined with a back-plane, thereby allowing the top gate and said oxide of said top gate to be scalable according to a size of said memory, said back-plane being selectively contactable without an insulating layer therebetween, wherein a memory device is realized when said back-plane is unconnected and said memory assumes one of a charged and a discharged state, and wherein a logic device of said memory is realized when said back-plane is directly contacted to form a bottom gate.

15. The memory according to claim 14, wherein said connectable gate is formed from at least one of silicon and W, WN, and TiN.

16. The memory according to claim 14, wherein said connectable gate includes at least one of a semiconductor material and a metal.

17. The memory according to claim 14, said connectable gate being buried under a transistor channel, and wherein a charge on the connectable gate determines a threshold voltage of the memory.

18. The memory according to claim 14, wherein an injection oxide for the buried connectable gate is made larger while the oxide for the top gate is scalable to smaller dimensions, thereby decoupling scaling the floating gate's thickness from the top gate's thickness.

19. A memory system including a back-plane, comprising:

a plurality of transistors, each of said transistors including a control gate and a transistor channel;

a floating gate memory structure opposite to the control gate and beneath the transistor channel, said floating gate memory structure combined with a back-gate formed on the back-plane, said back-plane being selectively contactable without an insulating layer therebetween; and a common conducting substrate extending substantially an entire length of multiple ones of said plurality of transistors, wherein a memory device is realized when said back-plane is unconnected and a memory assumes one of a charged and a discharged state, and wherein a logic device of said memory system is realized when said back-plane is directly contacted to form a bottom gate.

20. The memory system according to claim 19, further comprising a silicon layer over said floating gate memory structure, an interface of the floating gate memory structure and the silicon layer having an oxide, wherein said floating gate memory structure controls a threshold voltage of said memory and maintains carriers at said interface, and wherein said floating gate memory structure stores charge and affects the threshold voltage of the control gate of the transistor thereabove.

21. The memory system according to claim 19, further comprising a substrate on which said back-gate is formed, wherein the back-gate is charged by bias that is conducive to electron injection into the floating gate memory structure by raising the channel higher in energy with respect to the substrate, and wherein an absence of charge in the floating gate memory structure leads to a predetermined, low state of threshold voltage and a presence of charge leads to a predetermined higher state of threshold voltage for the transistor.

22. The semiconductor memory of claim 1, wherein said back-plane gate is individually dedicated to said transistor.

23. The backplane transistor of claim 11, wherein said connectable gate is individually dedicated to said transistor.

24. The memory of claim 14, wherein said connectable gate is individually dedicated to said transistor.

25. The memory system of claim 19, wherein said back-gate is individually dedicated to said transistor.

\* \* \* \* \*